(12) United States Patent
Uchida et al.

(10) Patent No.: US 10,561,031 B2
(45) Date of Patent: Feb. 11, 2020

(54) BOARD UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Koki Uchida, Mie (JP); Munsoku O, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/306,070

(22) PCT Filed: May 31, 2017

(86) PCT No.: PCT/JP2017/020335
§ 371 (c)(1),
(2) Date: Nov. 30, 2018

(87) PCT Pub. No.: WO2017/209204
PCT Pub. Date: Dec. 7, 2017

(65) Prior Publication Data
US 2019/0141844 A1 May 9, 2019

(30) Foreign Application Priority Data

Jun. 2, 2016 (JP) ................................ 2016-111349

(51) Int. Cl.
*H05K 5/00* (2006.01)
*H05K 5/03* (2006.01)
(Continued)

(52) U.S. Cl.
CPC ......... *H05K 5/0034* (2013.01); *H05K 5/0221* (2013.01); *H05K 5/03* (2013.01); *H05K 7/06* (2013.01); *H05K 7/1422* (2013.01)

(58) Field of Classification Search
CPC ...... H05K 5/0034; H05K 5/0221; H05K 5/03; H05K 7/06; H05K 7/1422
See application file for complete search history.

(56) References Cited

U.S. PATENT DOCUMENTS 4,959,018 A * 9/1990 Yamamoto ........... H01R 9/2458
174/559
5,023,752 A * 6/1991 Detter ................. B60R 16/0238
361/646
(Continued)

FOREIGN PATENT DOCUMENTS

JP       H10051931 A    2/1998
JP       H11041748 A    2/1999
(Continued)

OTHER PUBLICATIONS

International Search Report, Application No. PCT/JP2017/020335 dated Aug. 15, 2017.

*Primary Examiner* — Hoa C Nguyen
*Assistant Examiner* — Keith DePew
(74) *Attorney, Agent, or Firm* — Honigman LLP (57) ABSTRACT

A board unit includes a case accommodating a circuit board. A power terminal connects a lead-out part of a bus bar with a connection terminal of an electric wire. A cover covers the power terminal and has a lateral wall overlapping a peripheral wall part. The lateral surface of the peripheral wall part and the lateral wall includes an engagement protrusion and an engagement recess to be engaged with the engagement protrusion. The lateral wall of the cover includes a latch piece at a position offset from the engagement protrusion or the engagement recess in a longitudinal direction and a latch
(Continued)

portion to be latched with the latch piece which restricts displacement of the lateral wall of the cover in a direction away from the lateral surface of the peripheral wall part of the case.

7 Claims, 6 Drawing Sheets

(51) Int. Cl.
*H05K 7/06* (2006.01)
*H05K 5/02* (2006.01)
*H05K 7/14* (2006.01)

(56) References Cited

U.S. PATENT DOCUMENTS

| | | | | |
|---|---|---|---|---|
| 5,795,193 | A * | 8/1998 | Yang | H01R 9/2458 439/620.27 |
| 6,077,102 | A * | 6/2000 | Borzi | H01R 9/2458 439/364 |
| 6,350,949 | B1 * | 2/2002 | Boyd | B60R 16/0238 174/17.05 |
| 6,570,088 | B1 * | 5/2003 | Depp | B60R 16/0238 174/50 |
| 6,679,708 | B1 * | 1/2004 | Depp | H01R 9/2466 361/752 |
| 10,064,296 | B2 * | 8/2018 | Kubota | H05K 7/1432 |
| 10,090,657 | B2 * | 10/2018 | Kobayashi | H02G 3/081 |
| 10,131,297 | B1 * | 11/2018 | Kakimi | B60R 16/0238 |
| 10,187,969 | B2 * | 1/2019 | Ooi | H05K 1/0203 |
| 2002/0166690 | A1 * | 11/2002 | Chiriku | H02G 3/08 174/60 |
| 2002/0197893 | A1 * | 12/2002 | Hiroyuki | H01R 9/226 439/76.2 |
| 2005/0094356 | A1 * | 5/2005 | Onizuka | B60R 16/0238 361/611 |
| 2005/0111166 | A1 * | 5/2005 | Kita | B60R 16/0239 361/624 |
| 2005/0136708 | A1 * | 6/2005 | Shimoda | H01R 9/226 439/76.2 |
| 2006/0154518 | A1 * | 7/2006 | Yamane | H05K 7/026 439/535 |
| 2008/0119066 | A1 * | 5/2008 | Shimizu | H01R 9/226 439/76.1 |
| 2008/0119068 | A1 * | 5/2008 | Shimizu | H05K 5/0208 439/76.2 |
| 2010/0134975 | A1 * | 6/2010 | Shimizu | H02G 3/03 361/694 |
| 2011/0094794 | A1 * | 4/2011 | Asao | B60R 16/0238 174/549 |
| 2011/0310585 | A1 * | 12/2011 | Suwa | H05K 7/20927 361/820 |
| 2012/0268864 | A1 * | 10/2012 | Borowicz | H05K 5/0239 361/601 |
| 2016/0294075 | A1 * | 10/2016 | Shiraki | H01R 9/18 |
| 2016/0302313 | A1 * | 10/2016 | Ito | B29C 45/14 |
| 2017/0047720 | A1 * | 2/2017 | Kobayashi | H02G 3/16 |
| 2017/0072802 | A1 * | 3/2017 | Matsumura | H05K 7/026 |
| 2017/0105306 | A1 * | 4/2017 | Takahashi | H01M 2/206 |
| 2017/0149223 | A1 * | 5/2017 | Sasaki | H02G 3/16 |
| 2017/0305370 | A1 | 10/2017 | Yamashita | |
| 2017/0311433 | A1 * | 10/2017 | Sumida | H05K 1/0203 |
| 2017/0325341 | A1 * | 11/2017 | Ogane | B29C 70/72 |
| 2017/0341607 | A1 * | 11/2017 | Sumida | B60R 16/0239 |
| 2018/0076695 | A1 * | 3/2018 | Koshio | H02P 29/00 |
| 2018/0109044 | A1 * | 4/2018 | Kawamura | B60R 16/0238 |

FOREIGN PATENT DOCUMENTS

| | | |
|---|---|---|
| JP | 2001258120 A | 9/2001 |
| JP | 2005065420 A | 3/2005 |

* cited by examiner

BOARD UNIT

CROSS-REFERENCE TO RELATED APPLICATIONS

This application is the U.S. national stage of PCT/JP2017/020335 filed May 31, 2017, which claims priority of Japanese Patent Application No. JP 2016-111349 filed Jun. 2, 2016.

TECHNICAL FIELD

The present disclosure relates to a board unit.

BACKGROUND

A board unit which has a circuit board accommodated in a case is known in the art. In a board unit for vehicles, for example, an engagement structure for assembling a cover to the case utilizes engagement projections which are provided on lateral surfaces of the case, and engagement holes which are provided in lateral walls of the cover and engaged with the engagement projections, the lateral walls of the cover being arranged to overlap the lateral surfaces of the case (see JP 2005-151613A and JP 2006-275084A). Engagement between the engagement projections on the case and the engagement holes in the cover ensures engagement between the case and the cover in an assembled state.

A request for a board unit is to make sure that the cover is not detached from the case easily.

The above-mentioned engagement structure of the case and the cover relies on the engagement between the engagement projections and the engagement holes. If the cover is pressed from above, the lateral walls of the cover may deform outwardly in directions away from the lateral surfaces of the cover. Eventually, the engagement projections and the engagement holes may be disengaged from each other and may cause unnecessary detachment of the cover from the case. Once the cover is detached, components covered by the cover are exposed and cannot be properly protected by the cover.

Therefore, one of the objects of the present disclosure is to provide a board unit which can prevent unnecessary detachment of the cover from the case.

SUMMARY

A board unit according to the present disclosure includes a circuit board and a case having a peripheral wall part for accommodating the circuit board. A bus bar is electrically connected to the circuit board and has a lead-out part which extends out of the case. A power terminal connects the lead-out part of the bus bar with a connection terminal of an electric wire and a cover assembled to the case from above covers the power terminal and has a lateral wall, which overlaps a corresponding lateral surface of the peripheral wall part on an outer side thereof, wherein one of the lateral surface of the peripheral wall part of the case and the lateral wall of the cover is provided with an engagement protrusion, which protrudes toward the other of the lateral surface of the peripheral wall part of the case and the lateral wall of the cover, and the other of the lateral surface of the peripheral wall part of the case and the lateral wall of the cover is provided with an engagement recess to be engaged with the engagement protrusion, wherein the lateral wall of the cover is provided with a latch piece at a position offset from the engagement protrusion or the engagement recess in a longitudinal direction, and the peripheral wall part of the case is provided with a latch portion to be latched with the latch piece, and wherein latching between the latch piece and the latch portion restricts displacement of the lateral wall of the cover in a direction away from the lateral surface of the peripheral wall part of the case.

Effects of Disclosure

A board unit of the present disclosure can prevent unnecessary detachment of a cover from a case.

DETAILED DESCRIPTION OF PREFERRED EMBODIMENTS

To start with, embodiments of the present application are listed one by one.

A board unit according to an aspect of the present disclosure includes a circuit board and a case having a peripheral wall part for accommodating the circuit board. A bus bar is electrically connected to the circuit board and has a lead-out part which extends out of the case. A power terminal connects the lead-out part of the bus bar with a connection terminal of an electric wire. A cover is assembled to the case and covers the power terminal and has a lateral wall, which overlaps a corresponding lateral surface of the peripheral wall part on an outer side thereof, wherein one of the lateral surface of the peripheral wall part of the case and the lateral wall of the cover is provided with an engagement protrusion, which protrudes toward the other of the lateral surface of the peripheral wall part of the case and the lateral wall, and the lateral wall of the cover is provided with an engagement recess to be engaged with the engagement protrusion, wherein the lateral wall of the cover is provided with a latch piece at a position offset from the engagement protrusion or the engagement recess in a longitudinal direction, and the peripheral wall part of the case is provided with a latch portion to be latched with the latch piece, and wherein latching between the latch piece and the latch portion restricts displacement of the lateral wall of the cover in a direction away from the lateral surface of the peripheral wall part of the case.

According to the above-mentioned board unit, the at least one engagement protrusion provided on each of the lateral surfaces of the peripheral wall part of the case or each of the lateral walls of the cover is engaged with the at least one engagement recess provided in corresponding one of the lateral walls of the cover or corresponding one of the lateral surfaces of the peripheral wall part of the case which does not have the at least one engagement protrusion. Such engagement ensures engagement between the case and the cover in an assembled state. Besides, latching between the latch piece provided at each lateral wall of the cover and the latch portion provided at the peripheral wall part of the case restricts displacement of each lateral wall of the cover in a direction away from the corresponding lateral surface of the peripheral wall part of the case (an outward direction). As a result, even if the cover is pressed from above, the latching between the latch piece and the latch portion restricts displacement of each lateral wall in a direction of disengaging the engagement recess and the engagement protrusion from each other. Eventually, it is possible to keep stable engagement between each engagement projection and a corresponding engagement recess and to prevent unnecessary detachment of the cover from the case.

As an embodiment of the above-mentioned board unit, the engagement protrusion may be provided on the lateral surface of the peripheral wall part of the case, and the engagement recess is provided in the lateral wall of the cover, and the engagement recess may be a through hole.

In this case, each engagement recess is formed in the cover as a through hole. When the cover is assembled to the case, each through hole enables visual confirmation of the engagement between the engagement protrusion formed on the case and the engagement recess (the through hole) formed in the cover. Since the through holes allow easy visual confirmation of the engaged state of the engagement protrusion with the engagement recess (the through hole) from outside of the cover, the cover can be assembled to the case in a reliable manner.

As an embodiment of the above-mentioned board unit, the latch piece may be provided at a longitudinal end edge of the lateral wall of the cover.

If the latch piece is provided at a longitudinal end edge of each lateral wall of the cover, the latch piece can restrict outward displacement of the lateral wall of the cover easily and effectively, and can thereby prevent unnecessary detachment of the cover from the case. In particular, if the latch piece is provided at a longitudinal end edge on the free end of each lateral wall, outward displacement of the lateral wall can be restricted easily and effectively.

As an embodiment of the above-mentioned board unit, the latch portion may be a latch groove in which the latch piece is inserted.

If the latch portion is a latch groove which allows insertion of the latch piece into the peripheral wall part of the case, outward displacement of each lateral wall of the cover can be restricted easily.

Hereinafter, specific examples of a board unit according to the embodiment of the present disclosure are described with reference to the drawings. In the drawings, identical reference numerals denote components having identical names.

Embodiment 1

Board Unit

A board unit 1 according to Embodiment 1 is described with reference to FIG. 1 to FIG. 5. The board unit 1 is employed, for example, in vehicles such as an automobile equipped with a main battery and an auxiliary battery, for switching a power supply source to electrical components between the main battery and the auxiliary battery.

Figure 1:
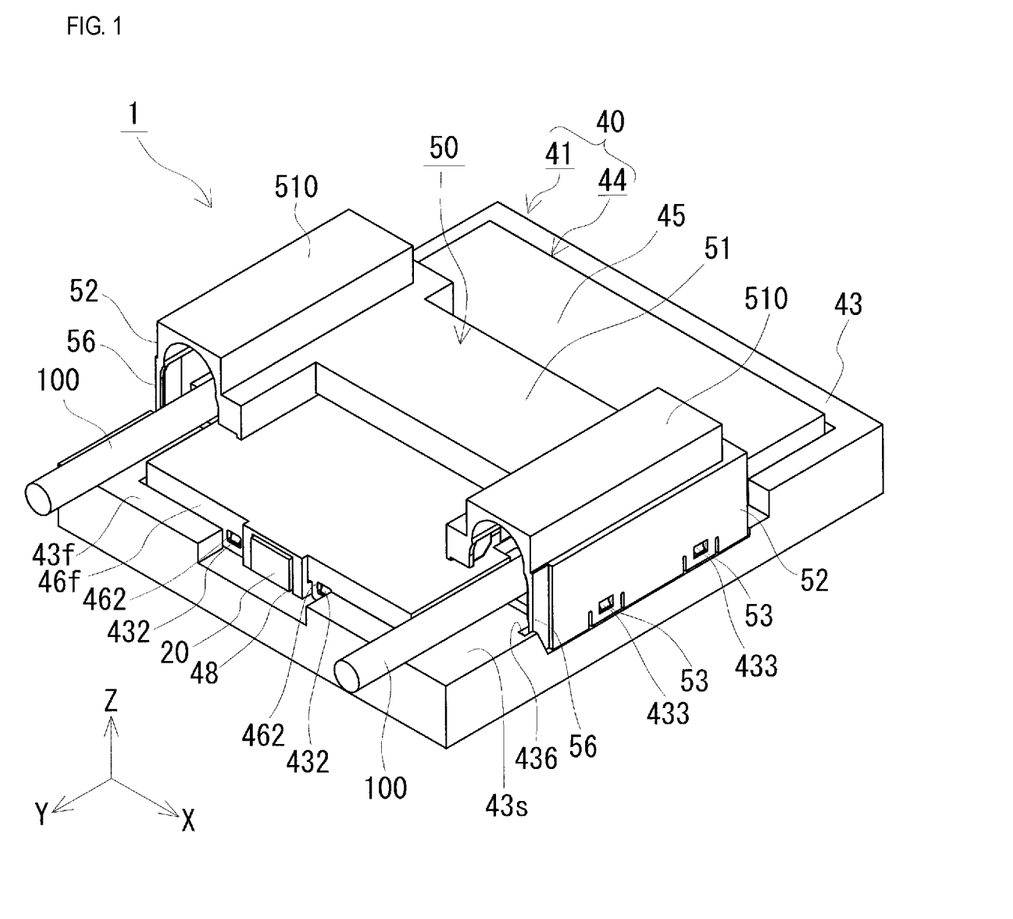
FIG. 1 is a schematic perspective view showing a board unit according to Embodiment 1.
Figure 2:
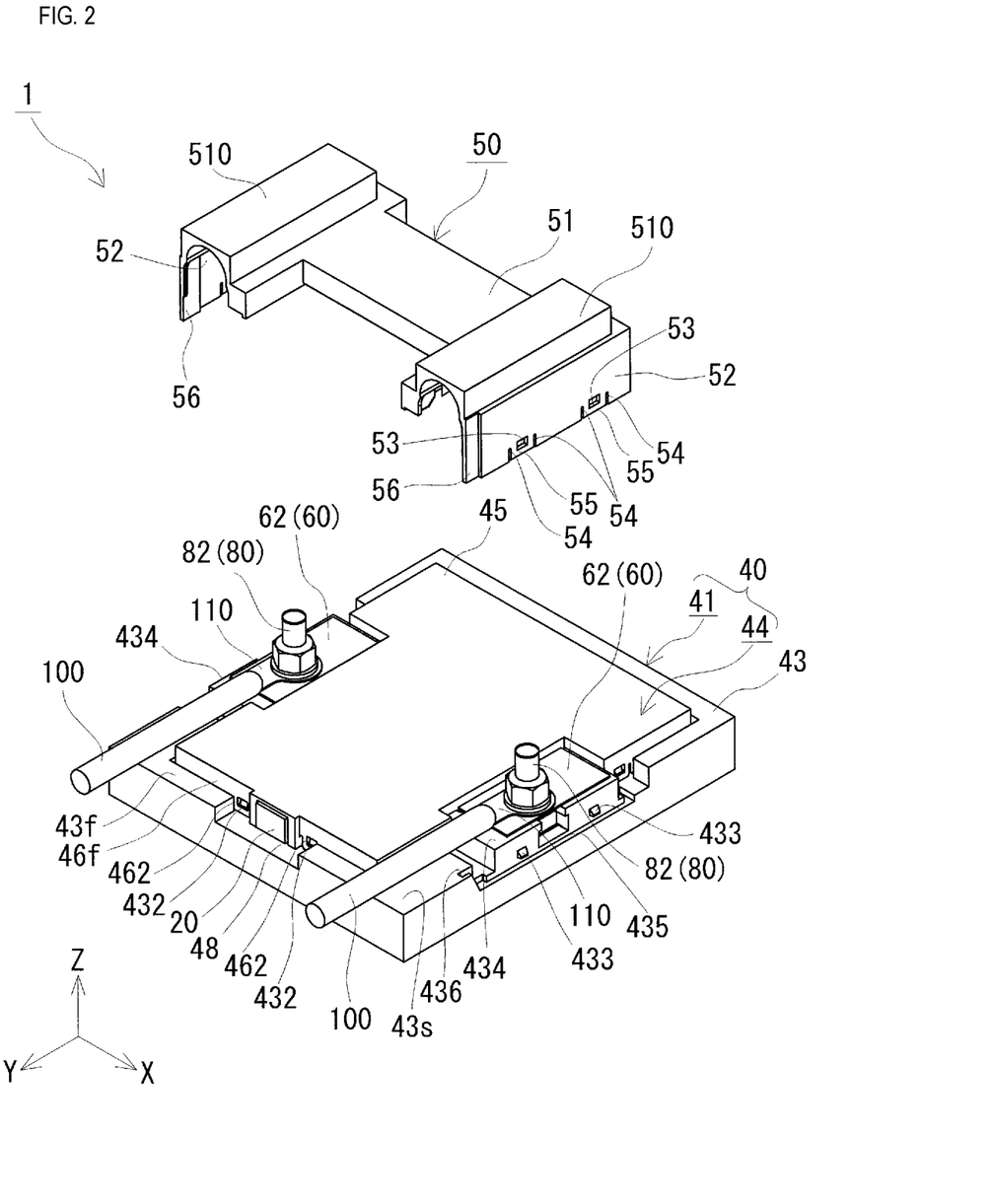
FIG. 2 is a schematic exploded perspective view of the board unit according to Embodiment 1.
Figure 3:
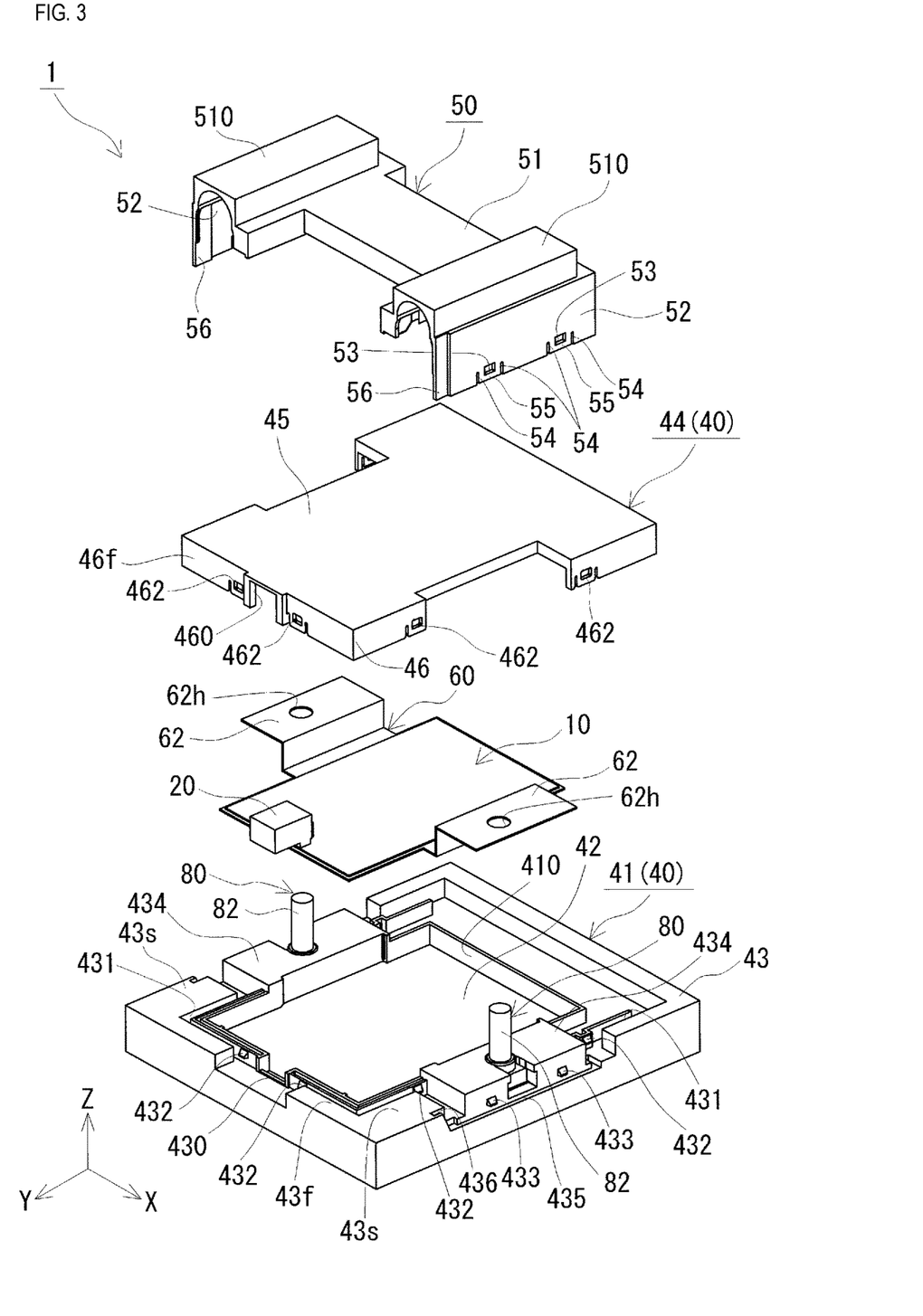
FIG. 3 is another schematic exploded perspective view of the board unit according to Embodiment 1.

As mainly shown in FIG. 1 to FIG. 3, the board unit 1 is provided with a circuit board 10 (see FIG. 3), a case 40 for accommodating the circuit board 10, a bus bar 60 electrically connected to the circuit board 10 (see FIG. 3), power terminals 80 for connecting lead-out parts 62 of the bus bar 60 with connection terminals 110 of electric wires 100 (see FIG. 2), and a cover 50 for covering the power terminals 80. The case 40 is composed of a lower case 41 and an upper case 44 (see FIG. 2 and FIG. 3). One of the features of the board unit 1 is an engagement structure between the case 40 and the cover 50 which includes an engagement mechanism and a disengagement restriction mechanism. In the state where the case 40 and the cover 50 are assembled to each other, components of the engagement mechanism are engaged with each other, and components of the disengagement restriction mechanism restrict disengagement of the components of the engagement mechanism. Specifically, as shown in FIG. 1 and FIG. 2, the case 40 and the cover 50 are provided with engagement protrusions 433 and engagement recesses 53 for mutual engagement, and are also provided with latch pieces 56 and latch portions 436 for mutual latching. Engagement between the engagement protrusions 433 and the engagement recesses 53 allows mutual engagement between the case 40 and the cover 50, and latching between the latch pieces 56 and the latch portions 436 restricts displacement of lateral walls 52 of the cover 50 in directions away from lateral surfaces of the case 40. Next, the structure of the board unit 1 is described in detail. The description of the board unit 1 refers to the following directions: up-down directions in which the cover 50 is on the upper side and the case 40 is on the lower side; forward-backward directions which are orthogonal to the up-down directions, and in which the connector unit 20 is located on the front side, and the opposite side is regarded as the back side; and left-right directions which are orthogonal to both the up-down directions and the forward-backward directions. In the drawings, Arrow Z points upward, Arrow Y points forward, and Arrow X points to the right.

Circuit Board

The circuit board 10, disposed on the bus bar 60 as shown in FIG. 3, is a substantially rectangular printed board having a conductive pattern (not shown) formed at least on a top surface thereof. The conductive pattern constitutes a conductive path for control. The circuit board 10 holds electronic components (not shown) including a FET (field effect transistor) and others like switching elements as well as the connector unit 20. The connector unit 20 is connected to a connector of an external control device (e.g., an electronic control unit, ECU).

Bus Bar

The bus bar 60 is a plate-like member which constitutes a conductive path for electric power. The bus bar 60 is fixed on the bottom surface side of the circuit board 10 and electrically connected to the circuit board 10. Although the detailed structure is omitted in the drawings, the bus bar 60 is composed of a plurality of bus bar pieces and arranged in a predetermined layout. The bus bar 60 is made of a conductive metal plate such as copper or a copper alloy which is cut into a predetermined shape by stamping or the like. The circuit board 10 and the bus bar 60 are integrally bonded together, for example, by an insulating adhesive agent such as an epoxy resin, an insulating adhesive sheet, etc.

The bus bar 60 has a substantially rectangular central part on which the circuit board 10 is disposed and lead-out parts 62 which are bent out of the central part and extend to the left and the right. As shown in FIG. 2, each of the lead-out parts 62 extends out of the case 40 and is electrically connected to a connection terminal 110 of an electric wire 100 (a wire harness). Each lead-out part 62 is provided with an insertion hole 62h through which a shaft 82 of a power terminal 80 (to be described) is inserted. One of the two electric wires 100 is connected to a main battery (not shown), and the other one is connected to an auxiliary battery (not shown).

Case

As shown in FIG. 2 and FIG. 3, the case 40 accommodates the circuit board 10 integrated with the bus bar 60. The case 40 includes a lower case 41 and an upper case 44 which are put together to constitute the case 40. The case 40 has an opening 48 at a position corresponding to the connector unit 20.

Lower Case

As shown in FIG. 3, the lower case 41 has a bottom panel part 42 for holding the circuit board 10 and a peripheral wall part 43 for accommodating the circuit board 10, and provides an accommodation space 410.

Peripheral Wall Part

The peripheral wall part 43 is a substantially rectangular frame-like member, and surrounds all sides of the outer periphery of the circuit board 10. A front wall portion 43*f* on the front side of the peripheral wall part 43 includes a lower indent 430 which forms the opening 48 (see FIG. 2). Lateral wall portions 43*s* on the left and right sides of the peripheral wall part 43 are provided with terminal blocks 434 on which the power terminals 80 are fixed. The lead-out parts 62 of the bus bar 60 rest on the terminal blocks 434. The peripheral wall part 43 is made of, for example, a resin such as polypropylene (PP) or polyamide (PA).

Power Terminals

Each of the power terminals 80 has a shaft 82 which protrudes upwardly from the terminal block 434. The shaft 82 passes through the insertion hole 62*h* formed in the lead-out part 62 of the bus bar 60. In this example, the power terminals 80 are stud bolts, and the shafts 82 are threaded externally. As shown in FIG. 2, each shaft 82 further passes through an insertion hole formed in the connection terminal 110 of the electric wire 100, and a nut or the like can be screwed to it. In this manner, the lead-out parts 62 of the bus bar 60 are tightly attached and electrically connected to the connection terminals 110 of the electric wires 100.

Bottom Panel Part

The bottom panel part 42 is a substantially rectangular plate-like member disposed on the bottom surface side of the circuit board 10, and holds the central part of the bus bar 60 thereon. The bottom panel part 42 is fitted in from below the peripheral wall part 43 and fixed on the peripheral wall part 43 by a screw or the like. In this example, the bus bar 60 is bonded on the top surface of the bottom panel part 42, for example, by an insulating adhesive agent such as an epoxy resin, an insulating adhesive sheet, etc. The bottom panel part 42 is a radiator plate and effectively discharges the heat generated in the circuit board 10 and the bus bar 60 to the outside. The bottom panel part 42 is made of, for example, a highly heat-conductive metallic material such as aluminium, copper, or an alloy thereof.

Engagement Projections

In the lower case 41, an insertion groove 431 is formed in the top surface of the peripheral wall part 43 to receive a peripheral wall 46 of the upper case 44 (to be described). On inner peripheral wall surfaces of the insertion groove 431, engagement projections 432 are provided for engagement with the upper case 44. The engagement projections 432 protrude from the wall surfaces of the insertion groove 431 and have a downwardly thickening wedge-like shape. Details of the engagement structure between the lower case 41 and the upper case 44 will be given later.

Engagement Protrusions

On lateral surfaces of the left and right lateral wall portions 43*s*, engagement protrusions 433 for engagement with the cover 50 protrude toward the lateral walls 52 of the cover 50 to be described (see FIG. 1 and FIG. 2). More specifically, on the lateral surface of each lateral wall portion 43*s*, two engagement protrusions 433 are arranged on the lateral surface of the terminal block 434, centrally and side by side in the forward-backward directions. The engagement protrusions 433 protrude from the lateral surface of each terminal block 434 and have a downwardly thickening wedge-like shape. The maximum protrusion height of the engagement protrusions 433 is less than the thickness of the lateral walls 52 of the cover 50. The lateral surface of each lateral wall portion 43*s* includes a stepped surface 435. The lateral surface of each terminal block 434 is positioned on and inwardly of a lower step of the stepped surface 435 in the left-right directions. Details of the engagement structure between the case 40 (the lower case 41) and the cover 50 will be given later.

Upper Case

As shown in FIG. 3, the upper case 44 is a member for covering the accommodation space 410 of the lower case 41 from above. The upper case 44 has a top panel part 45 to be disposed on the top surface side of the circuit board 10, and a peripheral wall 46 which extends downwardly from the periphery of the top panel part 45. The top panel part 45 and the peripheral wall 46 are formed as a single piece. A front wall 46*f* on the front side of the peripheral wall 46 includes an upper indent 460 which forms the opening 48 (see FIG. 2). The upper case 44 is made of, for example, a resin such as polypropylene (PP) or polyamide (PA).

Engagement Holes

The peripheral wall 46 is inserted into the insertion groove 431 formed in the lower case 41, and is engaged with the lower case 41. The peripheral wall 46 is provided with engagement holes 462 to be engaged with the engagement projections 432 provided in the insertion groove 431 of the lower case 41.

Engagement Structure Between Lower Case 41 and Upper Case 44

When the peripheral wall 46 of the upper case 44 is inserted from above into the insertion groove 431 in the lower case 41 (the peripheral wall part 43), as shown in FIG. 2 and FIG. 3, the upper case 44 is assembled to the lower case 41, with the engagement projections 432 of the lower case 41 being engaged with the engagement holes 462 in the upper case 44. Engagement between the engagement projections 432 and the engagement holes 462 ensures engagement of the lower case 41 and the upper case 44 in an assembled state to constitute the case 40 (see FIG. 2). A clearance is left between the lower case 41 and the upper case 44 and allows the lead-out parts 62 of the bus bar 60 to extend out of the case 40.

Cover

As shown in FIG. 1 and FIG. 2, the cover 50 is a member assembled to the case 40 (the lower case 41) from above in such a manner as to cover the power terminals 80. The cover 50 has a top wall 51 which is provided with left and right covering parts 510 for covering the power terminals 80, and a pair of left and right lateral walls 52 which extend downwardly from both lateral edges of the top wall 51. The left and right lateral walls 52, configured to engage with the lower case 41 of the case 40, are disposed on the lateral surfaces of the left and right lateral wall portions 43*s* in such a manner as to hold the case 40 from the left and right sides. More specifically, the lateral walls 52 are disposed to overlap the lateral surfaces of the terminal blocks 434 on an outer side thereof. The lower end edges of the lateral walls 52 abut on the stepped surfaces 435 formed on the lateral wall portions 43s. The external surfaces of the lateral walls 52 are substantially coplanar with the lateral surfaces of the lateral wall portions 43s. The top wall 51 is disposed on top of the case 40 (the upper case 44), and the covering parts 510 are open on the front side to receive the electric wires 100 (see FIG. 1). The cover 50 is made of, for example, a resin such as polypropylene (PP) or polyamide (PA).

Engagement Recess

Figure 4:
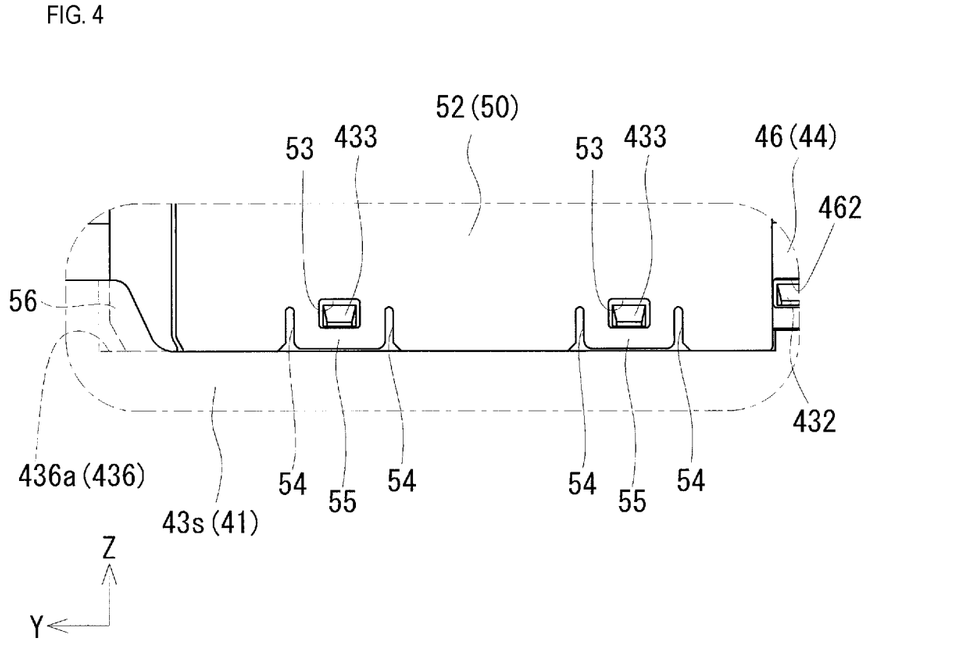
FIG. 4 is an enlarged schematic side view showing a main part of the board unit according to Embodiment 1.

Each of the lateral walls 52 has engagement recesses 53 to be engaged with the engagement protrusions 433 formed on the lateral surface of the corresponding lateral wall portion 43s (the terminal block 434) of the lower case 41. In this example, the engagement recesses 53 are through holes, and two such engagement recesses 53 are arranged centrally and side by side in the forward-backward directions (the longitudinal directions). As mentioned above, the maximum protrusion height of the engagement protrusions 433 is less than the thickness of the lateral walls 52 of the cover 50. Hence, the engagement protrusions 433 are contained in the engagement recesses 53 and do not stick out of the external surfaces of the lateral walls 52. Turning to FIG. 3 and FIG. 4, slits 54 are formed on both sides of each engagement recess 53 in the forward-backward directions, extending upwardly from the lower end of each lateral wall 52. Each pair of slits 54 defines a lock piece portion 55 therebetween, and each lock piece portion 55 includes the engagement recess 53. Each lock piece portion 55 is cantilevered between the pair of slits 54, and thus is easy to deform elastically in the left-right directions. The slits 54 extend from the lower end of each lateral wall 52 up to the height of the engagement recesses 53.

Engagement Structure Between Case 40 and Cover 50

As shown in FIG. 1 and FIG. 2, when the lateral walls 52 of the cover 50 are fitted from above on the lateral surfaces of the case 40 (the lower case 41), the cover 50 is assembled to the case 40, with the engagement protrusions 433 on the lateral surfaces of the lateral wall portions 43s (the terminal blocks 434) being engaged with the engagement recesses 53 in the lateral walls 52. Engagement between the engagement protrusions 433 and the engagement recesses 53 ensures engagement of the case 40 and the cover 50 in an assembled state (see FIG. 1). In this example, the engagement recesses 53 are provided in the lock piece portions 55 of the lateral walls 52 (see FIG. 3 and FIG. 4). In the process of assembling the cover 50 to the case 40 from above, this structure allows the lock piece portions 55 to deform elastically and to slide on the engagement protrusions 433. Then, at the position where the engagement protrusions 433 are engaged with the engagement recesses 53, this structure allows the lock piece portions 55 to recover elastically.

Further in the present embodiment, the latch pieces 56 are provided on the lateral walls 52 of the cover 50, and the latch portions 436 to be latched with the latch pieces 56 are provided in the lateral wall portions 43s of the case 40 (the lower case 41). In the state where the case 40 and the cover 50 are assembled to each other, latching between the latch pieces 56 and the latch portions 436 restricts displacement of the lateral walls 52 of the cover 50 in directions away from the lateral surfaces of the case 40 (outwardly in the left-right directions). The latch pieces 56 and the latch portions 436 are detailed below.

Latching Pieces

Figure 5:
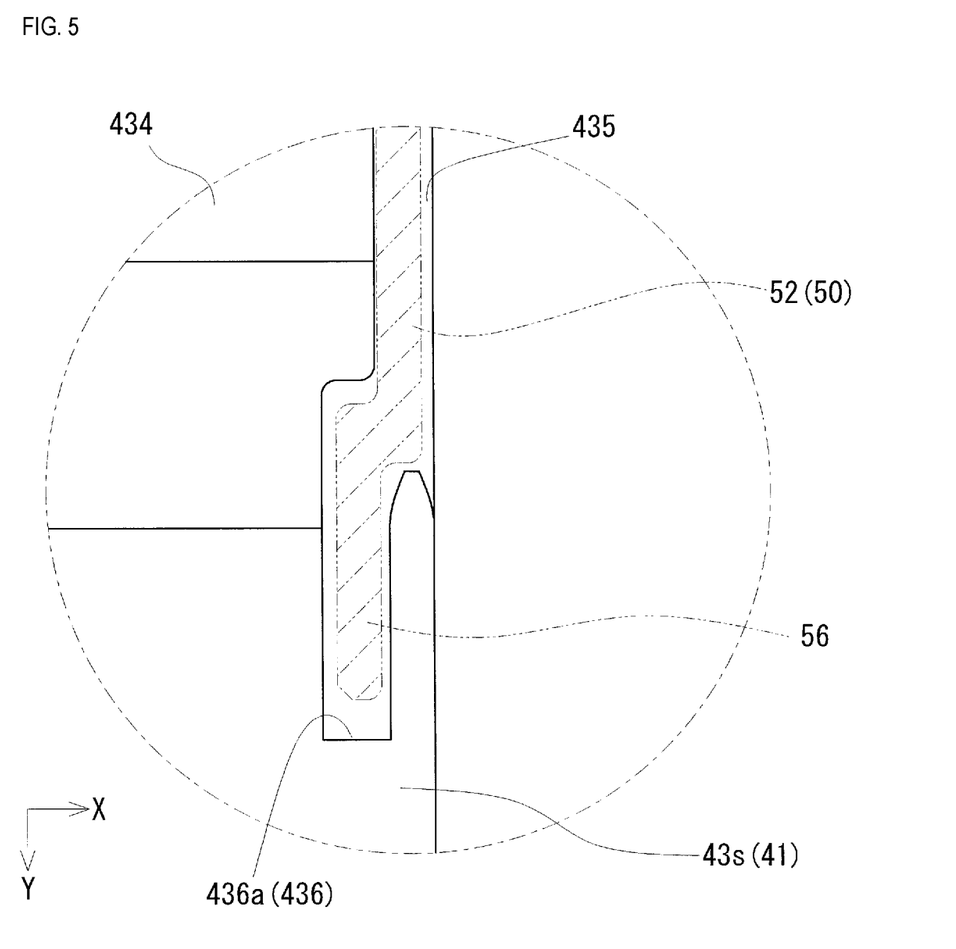
FIG. 5 is an enlarged schematic top view of a latch piece and a latch portion in Embodiment 1.

Each of the latch pieces 56 is positioned offset from the engagement recesses 53 in a forward-backward direction (a longitudinal direction) of the lateral wall 52. In this example, the latch piece 56 is formed at a front end edge of the lateral wall 52, the front end edge being one of the longitudinal end edges of the lateral wall 52 and being a free end on the open side of the cover 50 (the covering part 510) from which the electric wire 100 is inserted. Specifically, as shown in FIG. 5, each latch piece 56 bends inwardly from the front end edge of the lateral wall 52 and then extends forwardly. Each latch piece 56 has a substantially L-shaped cross section, taken along the plane orthogonal to the top-bottom directions (in FIG. 1, the XY-plane orthogonal to the Z-direction). In the left-right directions, the external surface of each latch piece 56 is positioned inwardly of the external surface of the lateral wall 52 having the engagement recesses 53. Each latch piece 56 simply needs to be formed at least on the lower end side of the lateral wall 52 so as to be latched with the latch portion 436.

Latching Portion

As shown in FIG. 5, each of the latch portions 436 in this example is a latch groove 436a in which the latch piece 56 is inserted and which is formed in the top surface of the lateral wall portion 43s of the case 40 (the lower case 41). Insertion of the latch pieces 56 in the latch grooves 436a restricts displacement of the lateral walls 52 outwardly in the left-right directions (hereinafter, "outwardly in the left-right directions" may be referred to as "outward").

Operation and Effects

The board unit 1 according to Embodiment 1 presents the following operation and effects.

Engagement between the engagement protrusions 433 provided on the lateral wall portions 43s of the case 40 (the lower case 41) and the engagement recesses 53 provided in the lateral walls 52 of the cover 50 ensures engagement between the case 40 and the cover 50 in an assembled state. Besides, latching between the latch pieces 56 provided at the lateral walls 52 of the cover 50 and the latch portions 436 provided at the lateral wall portions 43s of the case 40 restricts outward displacement of the lateral walls 52. As a result, even if the cover 50 is pressed from above, latching between the latch pieces 56 and the latch portions 436 restricts displacement of the lateral walls 52 in directions of disengaging the engagement recesses 53 and the engagement protrusions 433 from each other. Eventually, it is possible to keep stable engagement between the engagement protrusions 433 and the engagement recesses 53 and to prevent unnecessary detachment of the cover 50 from the case 40.

The engagement recesses 53 formed in the cover 50 are through holes. When the cover 50 is assembled to the case 40, the through holes enable visual confirmation of the engagement between the engagement protrusions 433 formed on the case 40 and the engagement recesses (the through holes) 53. Since the through holes allow easy visual confirmation of the engaged state of the engagement protrusions 433 with the engagement recesses 53 from outside of the cover 50, the cover 50 can be assembled to the case 40 in a reliable manner. Besides, the combination of the slits 54 provided in the lateral walls 52 with the engagement recesses 53 provided in the lock piece portions 55 allows easy engagement of the engagement protrusions 433 with the engagement recesses 53 by elastic deformation of the lock piece portions 55.

The latch portions 436 provided in the case 40 are latch grooves 436a. Insertion of the latch pieces 56 provided in the cover 50 into the latch grooves 436a can easily restrict outward displacement of the lateral walls 52 of the cover 50.

Modified Example 1

Figure 6:
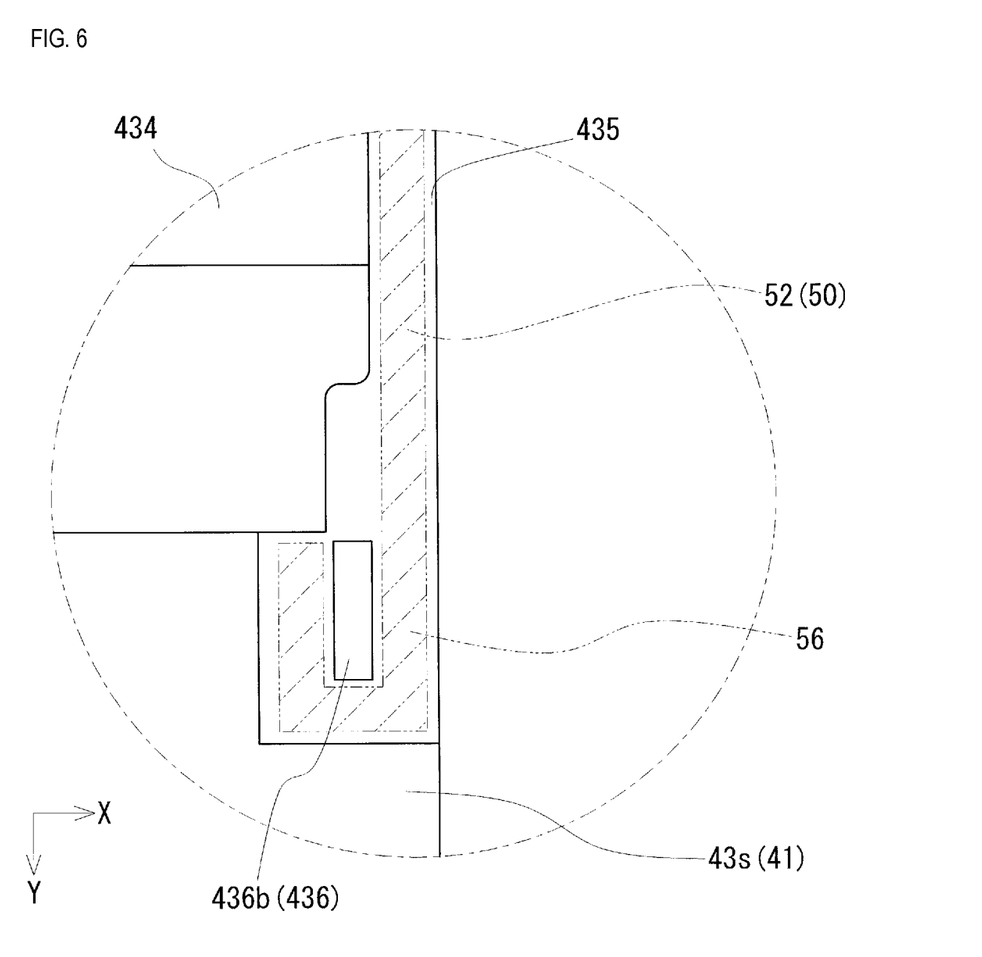
FIG. 6 is an enlarged schematic top view of a latch piece and a latch portion in Modified Example 1.

In the above-described example according to Embodiment 1, the latch portions 436 are the latch grooves 436a which are provided in the lateral wall portions 43s of the case 40 (the lower case 41) and in which the latch pieces 56 are inserted (see FIG. 5). Instead of the latch grooves 436a, the latch portions 436 may also be latch projections configured to abut on the latch pieces 56. In this case, the latch pieces 56 are formed to be latched on the latch projections. Referring to FIG. 6, Modified Example 1 relates to an example of forming latch projections as the latch portions 436.

In Modified Example 1 as shown in FIG. 6, each of the latch portions 436 is a latch projection 436b which projects upwardly from the top surface of the lateral wall portion 43s of the lower case 41. A latch piece 56 extends forwardly from the front end edge of the lateral wall 52, and is bent inwardly and then backwardly in such a manner as to sandwich the latch projection 436b. Each latch piece 56 has a substantially J-shaped cross section, taken along the plane orthogonal to the top-bottom directions. In this case, the latch pieces 56 are latched on the latch projections 436b, and such latching can restrict outward displacement of the lateral walls 52 of the cover 50.

Modified Example 2

In the above-described example according to Embodiment 1, the engagement protrusions 433 are provided on the lateral wall portions 43s of the case 40 (the lower case 41), and the engagement recesses 53 are provided in the lateral walls 52 of the cover 50 (see FIG. 1 and FIG. 2). Instead, engagement protrusions may be provided on the lateral walls 52 of the cover 50, and engagement recesses may be provided in the lateral wall portions 43s of the case 40. Specifically, engagement protrusions may protrude from inner surfaces of the lateral walls 52 of the cover 50 toward the lateral surfaces of the lateral wall portions 43s of the case 40, and engagement recesses to be engaged with the engagement protrusions may be provided in the lateral surfaces of the lateral wall portions 43s of the case 40. Also in this case, engagement between the engagement protrusions and the engagement recesses enables engagement between the case 40 and the cover 50. In Modified Example 2, the latch pieces 56 are positioned offset from the engagement protrusions provided on the lateral walls 52 of the cover 50, in a forward-backward direction (a longitudinal direction) of the lateral walls 52.

The present disclosure is not limited to the above-described examples, but is intended to encompass all variations indicated by, equivalent to, and falling within the equivalency range of, the appended claims. In Embodiment 1 described above, the present disclosure is applied to, but should not be limited to, the board unit 1 employed for switching a power supply source to electrical components between the main battery and the auxiliary battery. As an alternative example, the present disclosure may be applied to a board unit for a different use provided in a path from the power source to a load in vehicles.

USES OF EMBODIMENT OF DISCLOSURE

The board unit according to the embodiment of the present disclosure is suitably applicable to high-current power control units including a DC/DC converter, an AC/DC converter, a DC/AC inverter, etc., to be installed in vehicles such as automobiles.

The invention claimed is:
1. A board unit comprising:
a circuit board;
a case having a peripheral wall for accommodating the circuit board, the peripheral wall including a pair of side walls, a front wall and a back wall;
a bus bar electrically connected to the circuit board and having a lead-out part which extends out of the case;
a power terminal connecting the lead-out part of the bus bar with a connection terminal of an electric wire; and
a cover assembled to the case from above so as to cover the power terminal and having a lateral wall, which overlaps a corresponding lateral surface of one of the pair of side walls and on an outer side thereof,
wherein one of the pair of side walls and the lateral wall of the cover is provided with an engagement protrusion protruding outwardly with respect to the cover, and the other of the one of the pair of side walls of the case and the lateral wall of the cover is provided with an engagement recess to be engaged with the engagement protrusion,
wherein the lateral wall of the cover is provided with a latch piece at a position that is axially offset from the engagement protrusion or the engagement recess in a longitudinal direction defining a longitudinal length of the lateral wall, and the one of the pair of side walls of the case is provided with a latch portion to be latched with the latch piece, the engagement protrusion and the latch portion being coplanar with each other on the lateral wall, and
wherein latching between the latch piece and the latch portion restricts displacement of the lateral wall of the cover with respect to the case.
2. The board unit according to claim 1,
wherein the engagement protrusion is provided on the lateral surface of the peripheral wall part of the case, and the engagement recess is provided in the lateral wall of the cover, and
wherein the engagement recess is a through hole.
3. The board unit according to claim 2, wherein the latch piece is provided at a free end of the lateral wall of the cover.
4. The board unit according to claim 2, wherein the latch portion is a latch groove in which the latch piece is inserted.
5. The board unit according to claim 1, wherein the latch piece is provided at a free end of the lateral wall of the cover.
6. The board unit according to claim 5, wherein the latch portion is a latch groove in which the latch piece is inserted.
7. The board unit according to claim 1, wherein the latch portion is a latch groove in which the latch piece is inserted.

* * * * *